US012642079B2

(12) United States Patent

Guler et al.

(10) Patent No.: US 12,642,079 B2

(45) Date of Patent: May 26, 2026

(54) INTERCONNECT FEATURE CONTACTED WITHIN A RECESS

(71) Applicant: Intel Corporation, Santa Clara, CA (US)

(72) Inventors: Leonard P. Guler, Hillsboro, OR (US); Tahir Ghani, Portland, OR (US); Charles H. Wallace, Portland, OR (US); Desalegne B. Teweldebrhan, Sherwood, OR (US)

(73) Assignee: INTEL CORPORATION, Santa Clara, CA (US)

( * ) Notice: Subject to any disclaimer, the term of this patent is extended or adjusted under 35 U.S.C. 154(b) by 207 days.

(21) Appl. No.: 17/685,539

(22) Filed: Mar. 3, 2022

(65) Prior Publication Data

US 2023/0282574 A1 Sep. 7, 2023

(51) Int. Cl.
*H01L 23/528* (2006.01)
*H01L 21/768* (2006.01)
*H01L 23/522* (2006.01)

(52) U.S. Cl.
CPC .... *H01L 23/5283* (2013.01); *H01L 21/76816* (2013.01); *H01L 21/76831* (2013.01); *H01L 21/76897* (2013.01); *H01L 23/5226* (2013.01)

(58) Field of Classification Search
CPC ............. H01L 23/5283; H01L 23/5226; H01L 21/76831; H01L 21/76897
See application file for complete search history.

(56) References Cited

U.S. PATENT DOCUMENTS

| | | | | |
|---|---|---|---|---|
| 9,461,143 B2 * | 10/2016 | Pethe | ................ | H01L 21/76807 |
| 10,153,233 B1 * | 12/2018 | Huang | ............. | H01L 23/53295 |
| 2015/0171011 A1 | 6/2015 | Kato | | |
| 2017/0025354 A1 | 1/2017 | Watanabe et al. | | |
| 2017/0053863 A1 | 2/2017 | Lu et al. | | |
| 2019/0363048 A1 * | 11/2019 | Zhao | ................ | H01L 21/76879 |
| 2020/0135560 A1 | 4/2020 | Clevenger et al. | | |
| 2020/0303254 A1 | 9/2020 | Parikh | | |
| 2021/0066120 A1 * | 3/2021 | Yang | ................ | H01L 21/76808 |
| 2021/0111070 A1 * | 4/2021 | Bae | ................... | H01L 21/76895 |

OTHER PUBLICATIONS

Extended European Search Report received for EP Application No. 23154118.6 dated Jul. 13, 2023. 10 pages.

* cited by examiner

*Primary Examiner* — Daniel Luke
(74) *Attorney, Agent, or Firm* — Arcane Law PLLC

(57) ABSTRACT

An integrated circuit device includes a first interconnect layer, and a second interconnect layer above the first interconnect layer. The first interconnect layer includes (i) a first dielectric material, (ii) a recess within the first dielectric material, and (iii) a first interconnect feature within the recess. In an example, a top surface of the first interconnect feature is at least 1 nanometer (nm), or at least 3 nm, or at least 5 nm below a top surface of the first dielectric material. The second interconnect layer includes (i) a second dielectric material, and (ii) a second interconnect feature within the second dielectric material. In an example, the second interconnect feature is at least in part above, and conductively coupled to, the first interconnect feature. In an example, a bottom section of the second interconnect feature is within a top section of the recess.

20 Claims, 8 Drawing Sheets

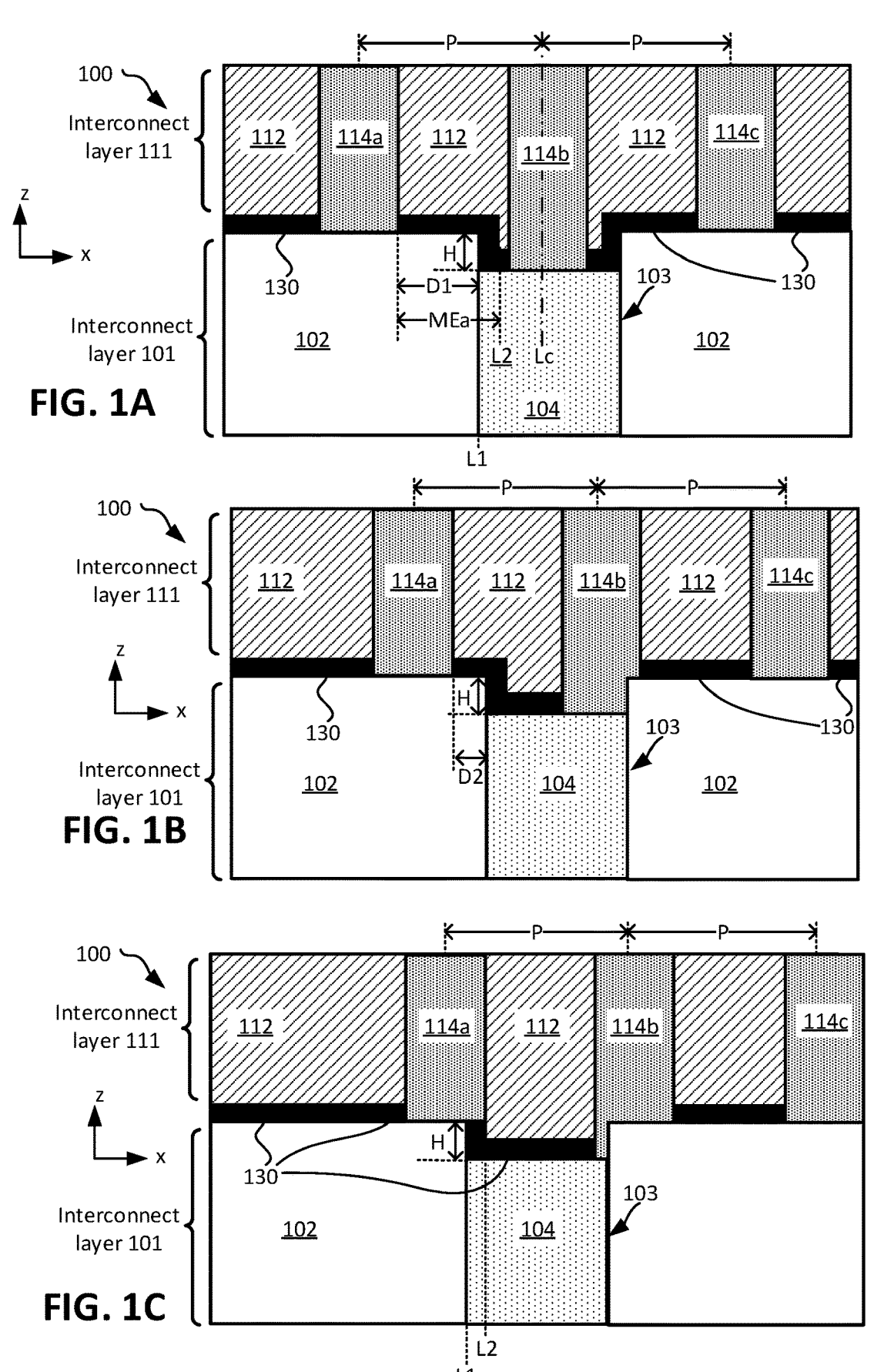

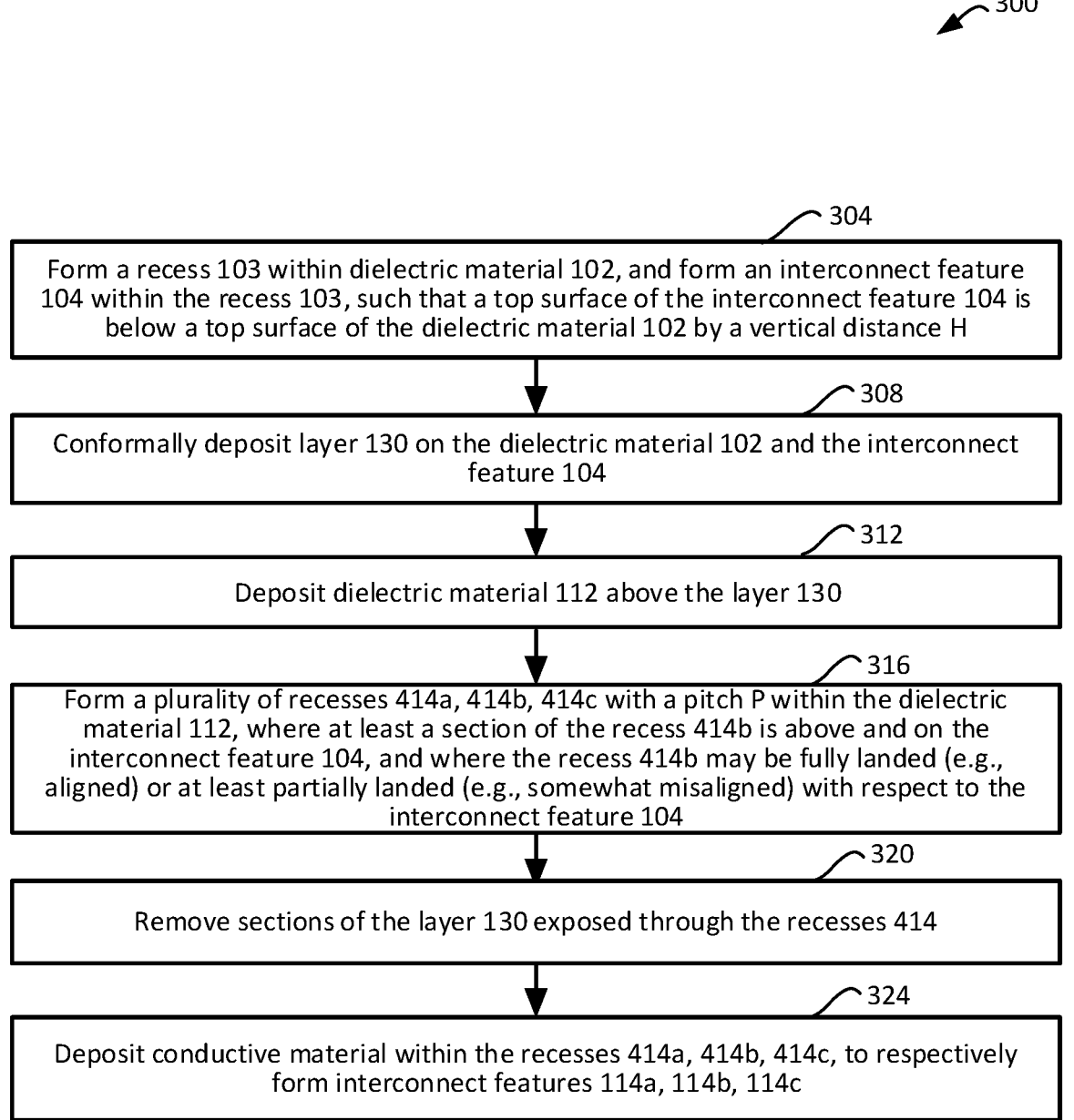

300

304

Form a recess 103 within dielectric material 102, and form an interconnect feature 104 within the recess 103, such that a top surface of the interconnect feature 104 is below a top surface of the dielectric material 102 by a vertical distance H

308

Conformally deposit layer 130 on the dielectric material 102 and the interconnect feature 104

312

Deposit dielectric material 112 above the layer 130

316

Form a plurality of recesses 414a, 414b, 414c with a pitch P within the dielectric material 112, where at least a section of the recess 414b is above and on the interconnect feature 104, and where the recess 414b may be fully landed (e.g., aligned) or at least partially landed (e.g., somewhat misaligned) with respect to the interconnect feature 104

320

Remove sections of the layer 130 exposed through the recesses 414

324

Deposit conductive material within the recesses 414a, 414b, 414c, to respectively form interconnect features 114a, 114b, 114c

INTERCONNECT FEATURE CONTACTED WITHIN A RECESS

BACKGROUND

Fabrication of microelectronic devices involves forming electronic components on microelectronic substrates, such as silicon wafers. These electronic components may include transistors, resistors, capacitors, and other active and passive devices, with overlying interconnect features (e.g., conductive vias and conductive lines) to route signals and power to and/or from the electronic components.

Scaling of microelectronic devices results in reduced pitch of the scaled interconnect features. Due to unintended technical limitations in the process to form the scaled interconnect features, interconnect features within an upper interconnect layer may be misaligned with respect to interconnect features within an underlying interconnect layer. Such misalignment may result in unintended electrical shorting of interconnect features. To this end, there remain non-trivial challenges with respect to forming scaled interconnect features.

BRIEF DESCRIPTION OF THE DRAWINGS

FIG. 1A illustrates a cross-sectional view of a section of an integrated circuit (IC) comprising a first interconnect layer and a second interconnect layer, wherein the first interconnect layer includes (i) dielectric material, (ii) a recess within the dielectric material, and (iii) a first interconnect feature within the recess, wherein a top surface of the first interconnect feature is at least 1 nanometer (nm) below a top surface of the dielectric material, and wherein the second interconnect layer above the first interconnect layer includes a second interconnect feature that is conductively coupled to and fully lands on the first interconnect feature, wherein at least a part of a bottom section of the second interconnect feature is within a top section of the recess, and wherein a conformal layer is between the first and second interconnect layers, in accordance with an embodiment of the present disclosure.

FIGS. 1B and 1C illustrate alternate examples of the IC of FIG. 1A, with the second interconnect feature being partially landed with respect to the first interconnect feature, in accordance with an embodiment of the present disclosure.

FIG. 3 illustrates a flowchart depicting a method of forming an IC (such as the IC of FIGS. 1A-1C) comprising a first interconnect layer and a second interconnect layer, wherein the first interconnect layer includes (i) a dielectric material, (ii) a recess within the dielectric material, and (iii) a first interconnect feature within the recess, wherein a top surface of the first interconnect feature is at least 1 nm below a top surface of the dielectric material, and wherein the second interconnect layer above the first interconnect layer includes a second interconnect feature that is conductively coupled to the first interconnect feature, wherein at least a part of a bottom section of the second interconnect feature is within a top section of the recess, and wherein a conformal layer is between the first and second interconnect layers, in accordance with an embodiment of the present disclosure.

FIGS. 4A, 4A1, 4B, 4C, 4D, 4D1, 4D2, 4E, and 4F illustrate cross-sectional views of an IC (such as the IC of FIGS. 1A, 1B, and 1C) in various stages of processing, in accordance with an embodiment of the present disclosure.

Figure 1D:
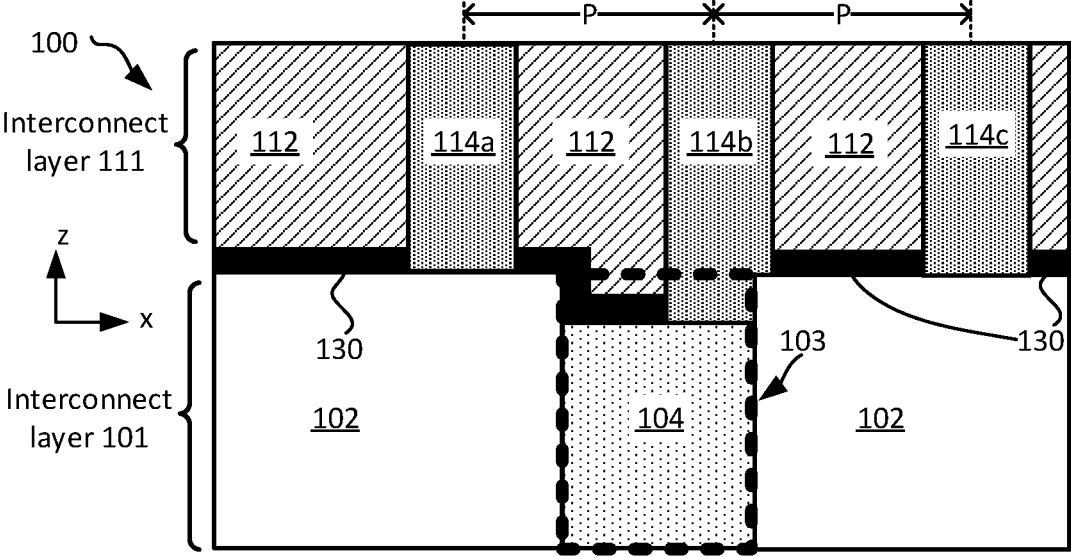
FIG. 1D illustrates a boundary of a recess within the dielectric material of the first interconnect layer of FIG. 1B, where the first interconnect feature is within a bottom portion of the recess, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles (e.g., curved or tapered sidewalls and round corners), and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Techniques are provided herein to improve metal-landing-on-metal process margin within an interconnect structure of an integrated circuit. In one embodiment, an integrated circuit device includes a first interconnect layer, and a second interconnect layer above the first interconnect layer. The first interconnect layer includes (i) a first dielectric material, (ii) a recess within the first dielectric material, and (iii) a first interconnect feature within the recess. In an example, a top surface of the first interconnect feature is at least 1 nanometer (nm), or at least 3 nm, or at least 5 nm below a top surface of the first dielectric material. The second interconnect layer includes (i) a second dielectric material, and (ii) a second interconnect feature within the second dielectric material. The second interconnect feature is at least in part above, and conductively coupled to, the first interconnect feature. In an example, a bottom section of the second interconnect feature is within a top section of the recess.

In another embodiment, an integrated circuit device includes a first dielectric material, a recess within the first dielectric material, and a first interconnect feature within a bottom portion of the recess. In an example, the first interconnect feature is not within a top portion of the recess. In an example, the integrated circuit device further includes a second dielectric material above the first dielectric material, and a second interconnect feature within the second dielectric material. In an example, (i) at least a section of the second dielectric material is within a first section of the top portion of the recess, and (ii) at least a section of second interconnect feature is within a second section of the top portion of the recess.

In yet another embodiment, a method of forming an integrated circuit includes forming a recess within a first dielectric material, forming a first interconnect feature within a bottom portion of the recess, depositing a second dielectric material above the first dielectric material, and forming a second interconnect feature within the second dielectric material. In an example, at least a section of the second dielectric material occupies a first section of a top portion of the recess. In an example, at least a section of the second interconnect feature occupies a second section of the top portion of the recess. Numerous variations, embodiments, and applications will be apparent in light of the present disclosure.

General Overview

As previously noted, there remain non-trivial challenges with respect to forming scaled interconnect features. For example, a bottom interconnect layer may comprise a plurality of bottom interconnect features, and a top interconnect layer may comprise a plurality of top interconnect features, where the top interconnect layer is above the bottom interconnect layer. In an example, assume that a first top interconnect feature is supposed to land on a bottom interconnect feature, and a second top interconnect feature (e.g., which is adjacent to the first top interconnect feature) is supposed to be electrically isolated from the bottom interconnect feature. However, due to unintended technical limitations in the process to form the interconnect features, the top interconnect features may be shifted slightly with respect to the bottom interconnect features, such that the first top interconnect feature only partially lands on the bottom interconnect feature. However, due to the unintended shifting of the top interconnect features, the second top interconnect feature may now be formed too close to the bottom interconnect feature, e.g., closer than a threshold lateral distance. Accordingly, a dielectric material of the bottom interconnect layer, which separates the second top interconnect feature and the bottom interconnect feature, may break down, resulting in unintended electrical shorting between the second top interconnect feature and the bottom interconnect feature.

In one example, to avoid such unintended electrical shorting between the interconnect features, a lateral distance margin for maximum possible shift or misalignment of the top interconnect features may be defined. The margin is a maximum lateral distance by which the top interconnect features may be shifted, without shorting the second top interconnect feature with the bottom interconnect feature. However, with increased scaling of the interconnect features, this margin also gets reduced, which imposes a challenge in forming the scaled top interconnect features. Accordingly, it may be desirable to increase this lateral margin, without correspondingly increasing the pitch of the top interconnect features.

Accordingly, techniques are provided herein to form an IC in which a bottom interconnect feature is formed within a bottom portion of a bottom recess, such that a vertical clearance H is always maintained between the bottom interconnect feature and the second top interconnect feature. For example, continuing with the above discussed example of (i) the bottom interconnect feature and (ii) the first and second top interconnect features, the bottom interconnect feature is formed within the bottom recess, where the bottom recess is within a bottom dielectric material of the bottom interconnect layer. The bottom interconnect feature does not completely fill the bottom recess. Rather, the bottom interconnect feature is within a bottom portion of the bottom recess.

Thus, for example, a top surface of the bottom interconnect feature is at the vertical clearance "H" below a top surface of the bottom dielectric material, where the vertical clearance H may be at least 1 nanometer (nm), or at least 2 nm, or at least 3 nm, or at least 4 nm, or at least 5 nm.

Subsequent to forming the bottom interconnect layer comprising (i) the bottom dielectric material and (ii) the bottom interconnect feature within the bottom recess of the bottom dielectric material, a conformal layer comprising a dielectric material is then deposited on the bottom interconnect layer. For example, the conformal layer covers a top surface of the bottom interconnect feature within the bottom recess, as well as a top surface of the bottom dielectric material.

The top dielectric material of the top interconnect layer is then deposited above and on the conformal layer. The top dielectric material is then patterned, and a plurality of top recesses are formed within the top dielectric material. The top recesses expose corresponding sections of the conformal layer.

Ideally, a first top recess (e.g., in which the first top interconnect feature is to be eventually formed) is to fully land on the bottom interconnect feature, and the bottom surface of the first top recess is to be fully over the bottom interconnect feature. However, in practice, due to unintended technical limitations in forming the plurality of top recesses, the plurality of recess may be unintentionally shifted, due to which the first top recess may only partially land on the bottom interconnect feature.

Subsequently, portions of the conformal layer exposed through the plurality of top recesses are removed (e.g., etched), and a corresponding plurality of top interconnect features are formed within the corresponding plurality of top recesses. For example, the previously discussed first top interconnect feature is formed within the first top recess, the second top interconnect feature is formed within a second top recess, and so on.

Accordingly, due to the above discussed unintended shifting of the top recesses, the first top interconnect feature may only partially land on the bottom interconnect feature. Furthermore, due to the above discussed shifting of the top recesses, the second top interconnect feature may now be laterally close to the bottom interconnect feature.

However, as previously discussed herein, there is a vertical clearance of H between the top surface of the bottom interconnect feature and the top surface of the bottom dielectric material. Also, the second top interconnect feature is formed above the top surface of the bottom dielectric material. Accordingly, the vertical distance of H is maintained between the bottom interconnect feature and the second top interconnect feature. The vertical distance H may be selected such that the dielectric material between the bottom interconnect feature and the second top interconnect feature, separated by at least the vertical distance H, does not break down. Thus, the vertical distance H prevents any possible electrical shorting between the bottom interconnect feature and the second top interconnect feature, e.g., even if the second top interconnect feature is laterally close enough to the bottom interconnect feature due to the unintended shifting of the top recesses.

Note that the conformal layer is present on top sidewalls of the bottom recess that is not occupied by the first top interconnect feature. Accordingly, the second top interconnect feature may have a maximum shift up to an edge of the conformal layer, as will be discussed herein later in further detail (e.g., see FIG. 1C). Thus, even if the second top interconnect feature is maximally shifted, the second top interconnect feature would still be separated by the conformal layer, having a height of H, from the bottom interconnect feature (e.g., as discussed herein later with respect to FIG. 1C). As discussed, the vertical clearance H is sufficient to prevent breakdown of the dielectric material between the bottom interconnect feature and the second top interconnect feature. Accordingly, the vertical clearance H prevents electrical shorting between the bottom interconnect feature and the second top interconnect feature.

Thus, now there is no need to maintain a sufficient lateral distance between the bottom interconnect feature and the second top interconnect feature, due to the vertical clearance H between the bottom interconnect feature and the second top interconnect feature. Thus, the top recesses may now shift even more, resulting in an increase in a lateral margin for the unintended lateral shift of the top recesses, without any corresponding increase of the pitch of the top recesses. Put differently, this results in an increase in a lateral margin for the unintended lateral shift of the top interconnect features, without any corresponding increase of the pitch of the top interconnect features.

Note that the conformal layer acts as an etch stop layer, when the top recesses are formed, according to an embodiment. Furthermore, the conformal layer also provides additional lateral margin for the top recesses to be sifted, as discussed herein above and also in turn. Although the conformal layer is present in the IC in some embodiments, in some other embodiments, the conformal layer may be absent from the IC. In such an embodiment, the top dielectric material and the bottom dielectric material may be etch selective with respect to each other, and the bottom dielectric material may act as an etch stop layer when forming the top recesses within the top dielectric material. Furthermore, in some such embodiments, the vertical clearance still separates the second top interconnect feature from the bottom interconnect feature. In some such embodiments, the second top interconnect feature may have a maximum shift up to an edge of the bottom recess.

Thus, in one embodiment, forming the bottom interconnect feature within the bottom recess, and providing a vertical clearance of H between the top surface of the bottom interconnect feature and the top surface of the bottom dielectric material provides an increased margin for shifting the top recesses. Accordingly, in an example, this facilitates formation of tight pitch scaled top interconnect features, without the previously discussed unintended electrical shorting of the second top interconnect feature and the bottom interconnect feature.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may be used to detect a bottom interconnect feature formed within a bottom portion of a recess, where the recess is within a bottom dielectric material of a bottom interconnect layer. In some such embodiments, such tools may also be used to detect a top surface of the bottom interconnect feature being at least 1 nm below, or at least 2 nm below, or at least 3 nm below, or at least 5 nm below a top surface of the bottom dielectric material; and a top interconnect feature within a top dielectric material of a top interconnect layer partially landing on the bottom interconnect feature, where a bottom section of the top interconnect feature is within a top section of the recess. Numerous configurations and variations will be apparent in light of this disclosure.

Architecture and Methodology

FIG. 1A illustrates a cross-sectional view of a section of an integrated circuit (IC) 100 comprising a first interconnect layer 101 and a second interconnect layer 111, wherein the first interconnect layer 101 includes (i) dielectric material 102, (ii) a recess 103 within the dielectric material 102, and (iii) a first interconnect feature 104 within the recess 103, wherein a top surface of the first interconnect feature 104 is at least 1 nanometer (nm) below a top surface of the dielectric material 102, and wherein the second interconnect layer 111 above the first interconnect layer 101 includes a second interconnect feature 114b that is conductively coupled to and fully lands on the first interconnect feature 104, wherein at least a part of a bottom section of the second interconnect feature 114b is within a top section of the recess 103, and wherein a conformal layer 130 is between the first and second interconnect layers, in accordance with an embodiment of the present disclosure. FIGS. 1B and 1C illustrate alternate examples the IC 100 of FIG. 1A, with the second interconnect feature 114b being partially landed with respect to the first interconnect feature 104, in accordance with an embodiment of the present disclosure Referring to FIGS. 1A-1C, as illustrated, the interconnect layer 101 comprises the dielectric material 102, with a plurality of interconnect features within the dielectric material 102, although only one such interconnect feature 104 is illustrated in FIG. 1A as an example. In an example, the interconnect feature 104 comprises conductive material, such as copper, ruthenium, molybdenum, cobalt, tungsten, an alloy such as copper-tin (CuSn), copper indium (CuIn), copper-antimony (CuSb), copper-bismuth (CuBi), copper-rhenium (CuRe), and/or any other suitable conductive material.

In an example, a liner or barrier layer is on walls of the interconnect feature 104, e.g., between the conductive material of the interconnect feature 104 and the dielectric material 102, although such liner or barrier layer is not illustrated in FIGS. 1A-1C for purposes of illustrative clarity. In an example, such a liner or barrier layer facilitates better adhesion of the conductive material of the interconnect feature 104 to the walls of the recess 103, and/or prevents or reduces diffusion of the conductive material of the interconnect feature 104 to adjacent dielectric material 102. Suitable materials for the linear or barrier layer include refractory metals and alloys, cobalt, cobalt-nickel (CoNi), ruthenium-cobalt combination, molybdenum, nickel, manganese, titanium-tungsten (Ti), tantalum (Ta), tantalum-nitride (TaN), tantalum-silicon-nitride (TaSiN), titanium-nitride (TiN), titanium-silicon-nitride (TiSiN), tungsten (XV), tungsten-nitride (WN), tungsten-silicon-nitride (WiSiN), and/or combinations of such materials (e.g., a multi-lay stack of Ta/TaN). However, in another example, the interconnect feature 104 lacks any such liner or barrier layer.

In an example, the dielectric material 102 may be any appropriate dielectric material, such as an Interlayer Dielectric (ILD) material, an oxide or nitride (such as silicon oxide or silicon nitride), oxocarbon, a dielectric material comprising an appropriate combination of silicon, nitrogen, oxygen, or carbon, or an appropriate low-k dielectric material used in interconnect layers.

In an example, the interconnect feature 104 may be a conductive via that is conductively coupled to the interconnect feature 114*b*. Although not illustrated, a bottom section of the interconnect feature 104 may be conductive coupled to another interconnect feature and/or an active or passive device. For example, one or more interconnect layers and/or one or more active and/or passive devices (such as transistors) may be below the interconnect layer 101, although not illustrated in the figures.

The interconnect layer 111 is above the interconnect layer 101. In one embodiment, the interconnect layer 111 comprises dielectric material 112, and a plurality of interconnect features 114 within the dielectric material 112. In the example of FIGS. 1A-1C, three example interconnect features 114*a*, 114*b*, 114*c* are illustrated, although the IC 100 is likely to include several such interconnect features.

Each interconnect feature 114 comprises conductive material, such as copper, ruthenium, molybdenum, cobalt, tungsten, an alloy such as copper-tin (CuSn), copper indium (CuIn), copper-antimony (CuSb), copper-bismuth (CuBi), copper-rhenium (CuRe), and/or any other suitable conductive material. As also discussed herein previously, in an example, the interconnect feature 104 also comprises conductive material. In an example, the interconnect feature 104 and the interconnect features 114 may comprise the same conductive material. In another example, the interconnect feature 104 and the interconnect features 114 may comprise different conductive material.

In an example, the interconnect features 104 and 114*b* are formed at different times, e.g., using different process flow. For example, formation of interconnect feature 104 is discussed with respect to FIG. 4A, and subsequent formation of interconnect feature 114*b* is discussed with respect to FIG. 4F. Thus, a seam, an interface, or a grain boundary is formed between the conductive material of the interconnect feature 104 and the conductive material of the interconnect feature 114. Thus, even if the conductive materials of the interconnect features 104, 114*b* are the same, the seam may be present at the junction or boundary of the two interconnect features 104, 114*b*.

As illustrated, the junction or boundary of the two interconnect features 104, 114*b* (and hence the interface between the conductive materials of the two interconnect features

104, 114*b*) is at a vertical distance H from the top surface of the dielectric material 102. That is, a top surface of the interconnect feature 104 is below a top surface of the adjacent dielectric material 102 by the vertical distance H.

In an example, a liner or barrier layer is on walls of individual interconnect feature 114 (e.g., as discussed with respect to interconnect feature 104), although in another example the interconnect features 114 lack any such liner or barrier layer. In an example, the interconnect features 114 are conductive lines of the interconnect layer 111.

As illustrated in FIGS. 1A-1C, the interconnect feature 114*b* at least in part lands on the interconnect feature 104. For example, in the example of FIG. 1A, the interconnect feature 114*b* is fully landed with respect to the interconnect feature 104, and the dotted line Lc illustrates the centers of the interconnect features 114*b* and 104 coincide, although such alignment is not required. Note how an entirety of a bottom surface of the interconnect feature 114*b* is above and on a top surface of the interconnect feature 104. On the other hand, in FIGS. 1B-1C, the interconnect feature 114*b* is partially landed or misaligned with respect to the interconnect feature 104, such that, a first section of the bottom surface of the interconnect feature 114*b* is above and on the top surface of the interconnect feature 104, and a second section of the bottom surface of the interconnect feature 114*b* is above and on the top surface of the dielectric material 102. Irrespective of a position of the interconnect feature 114*b* with respect to the interconnect feature 104, as illustrated in FIGS. 1A-1C, at least a section of the interconnect feature 114*b* is above and on the interconnect feature 104.

Also illustrated in FIGS. 1A-1C are the interconnect features 114*a* and 114*c*. In an example, the conductive interconnect features 114*a*, 114*b*, 114*c* have a pitch of P. That is, a center of the interconnect feature 114*a* is laterally separated from a center of the interconnect feature 114*b* by the distance P, and a center of the interconnect feature 114*b* is laterally separated from a center of the interconnect feature 114*c* by the distance P. Note that the pitch P remains unchanged in FIGS. 1A-1C. For example, when forming the interconnect features 114*a*, 114*b*, 114*c* (see FIGS. 4D-4F herein later), the interconnect features 114*a*, 114*b*, 114*c* may be misaligned or shifted with respect to the interconnect feature 104. For example, the interconnect features 114*a*, 114*b*, 114*c* may shift in unison with respect to the interconnect feature 104, e.g., due to unintended technical limitations in placement of lithography masks used to form the interconnect features 114, as illustrated in FIGS. 1A-1C. However, irrespective of the shift of the interconnect features 114 with respect to the interconnect feature 104, the pitch of the interconnect features 114 remains unchanged at P in some embodiments, as also illustrated in FIGS. 1A-1C. Thus, the interconnect features 114 may shift in unison, such that the pitch of the interconnect features 114 remain unchanged at P irrespective of the shift.

Note that the interconnect feature 114*a* and/or 114*c* may be coupled to another interconnect feature within the interconnect layer 101, although such an interconnect feature is not illustrated (or is not visible) in the cross-sectional view of FIGS. 1A-1C.

In one embodiment, the dielectric material 102 and the dielectric material 112 are separated by a layer 130, as illustrated in FIGS. 1A-1C. Note that in some other embodiments (e.g., see FIGS. 2A-2C), the layer 130 may be absent from the IC 100. In an example, the layer 130 at least in part separates the interconnect layers 101 and 111. The layer 130 is conformally deposited in an example, and hence, is also referred to herein as a conformal layer 130.

Note that the layer 130 is not between the interconnect features 114a, 114b, 114c and the dielectric material 102. Thus, the layer 130 is present between the dielectric materials 112 and 102, and is absent between the interconnect features 114 and dielectric material 102. As also illustrated, the layer 130 is also absent between a junction of the interconnect features 114b and 104. Furthermore, the layer 130 is present between a junction of the interconnect feature 104 and the dielectric material 112.

In one embodiment, the layer 130 acts as an etch stop layer, e.g., when forming recesses 414 for the interconnect features 114 within the dielectric material 112 (see FIGS. 4D-4D2 herein later). In one embodiment, the layer 130 comprises dielectric material, such as an appropriate nitride or an oxide, e.g., aluminum oxide, silicon nitride, silicon oxide, a combination of silicon, oxygen, nitrogen, and/or carbon, or another appropriate dielectric material. In an example, the layer 130 electrically isolates the interconnect feature 114a (or interconnect feature 114c) from the interconnect feature 104, e.g., especially in situations when the interconnect feature 114a is laterally close to the interconnect feature 104, e.g., due to the previously discussed shift of the interconnect features 114, as seen in FIG. 1C and as will be discussed herein in turn in further detail.

Referring again to the interconnect layer 101, the recess 103 is within the dielectric material 102, and the interconnect feature 104 is within the recess 103. As illustrated in FIGS. 1A-1C, the interconnect feature 104 occupies a bottom portion, and not a top portion, of the recess 103. For example, a top surface of the interconnect feature 104 is at a lower level than a top surface of the dielectric material 102. For example, FIGS. 1A-1C illustrate a vertical distance H (e.g., along the vertical or Z axis direction) between the top surface of the interconnect feature 104 and the top surface of the dielectric material 102.

In an example, the distance H is based on a breakdown voltage of the layer 104 and/or a dielectric strength of the layer 104. For example, in FIG. 1A where the interconnect feature 114 is fully landed with respect to the interconnect feature 104, the interconnect feature 114a is at a lateral distance D1 and the vertical distance H from the interconnect feature 104.

More specifically, FIG. 1A illustrates two lines L1 and L2. Vertical line L1 coincides with a left vertical edge of the interconnect feature 104, whereas vertical line L2 coincides with a right vertical edge of the layer 130. As seen in FIG. 1A, when the interconnect feature 114b is fully landed on the interconnect feature 104, the interconnect feature 114a is a lateral distance D1 from the line L1, and the interconnect feature 114a is a lateral distance MEa from the line L2.

In one embodiment, the lateral distance MEa is a margin of error or a process margin, e.g., a maximum lateral distance by which the interconnect features 114 may be shifted to the right. For example, the interconnect feature 114a may shift laterally to the right by at most the distance MEa (e.g., from its intended position of FIG. 1A), and still there wouldn't be a breakdown or electrical short between the interconnect features 114a, 104. FIG. 1C illustrates the interconnect features 114 being shifted by the lateral distance MEa to the right, compared to its position in FIG. 1A.

In FIG. 1B where the interconnect feature 114 is somewhat off centered or misaligned or otherwise partially landed (e.g., with some overlap between the bottom surface of the interconnect feature 114b and the top surface of the interconnect feature 104) with respect to the interconnect feature 104, the interconnect feature 114a is at a lateral distance D2 and the vertical distance H from the interconnect feature 104. In FIG. 1C where the interconnect feature 114 is even more off centered or misaligned or otherwise partially landed (e.g., with even less overlap between the bottom surface of the interconnect feature 114b and the top surface of the interconnect feature 104) with respect to the interconnect feature 104, there is no lateral separation between the interconnect features 114a and 104, and the interconnect feature 114a is at the vertical distance H from the interconnect feature 104.

Thus, in FIG. 1A, a section of the dielectric material 102 having the width D1 and the height H separates the interconnect features 104, 114a, and maintains electrical isolation between the two interconnect features 104, 114b. In FIG. 1B, a section of the dielectric material 102 having the width D2 and the height H separates the interconnect features 104, 114a, and maintains electrical isolation between the two interconnect features 104, 114b.

In contrast, in FIG. 1C, at least a section of the interconnect feature 114a (e.g., right edge of the interconnect feature 114a) is above at least a corresponding section of the interconnect feature 104 (e.g., left edge of the interconnect feature 104). Thus, in FIG. 1C, there is no dielectric material 102 separating the right edge of the interconnect feature 114a and the left edge of the interconnect feature 104— rather, the right edge of the interconnect feature 114a and the left edge of the interconnect feature 104 are separated by the vertical distance H of the layer 130.

Thus, the vertical distance His selected such that in FIG. 1C, the layer 130 does not break down and conductively couples the interconnect features 104, 114a. That is, the distance H is selected to be sufficient to avoid a breakdown of the layer 130, and is based on voltages of the interconnect features 114, 104, and the type of dielectric material used for the layer 130. In an example, the vertical distance H, which is the vertical distance between the top surface of the interconnect feature 104 and the top surface of the dielectric material 102, is at least 1 nm, at least 2 nm, at least 3.5 nm, at least 5 nm, or at least 6 nm, and is implementation specific.

In an example, the vertical distance H is at least 5% or at least 10% of a total vertical length of the recess 130. In an example, the interconnect feature 104 occupies at most 70%, or at most 80%, or at most 90% of the recess 130. In an example, the interconnect feature 104 occupies a bottom portion of the recess, where the bottom portion of the recess is at most 70%, or at most 80%, or at most 90% of the recess 130.

Thus, the vertical clearance H and the layer 130 ensures that even if the interconnect features 114 shift during formation of the interconnect features 114 (e.g., resulting in a partially landed interconnect feature 114b), such a shift does not cause a breakdown between the interconnect features 114a, 104 (or between the interconnect features 114c, 104). Put differently, the vertical clearance H and the layer 130 improves acceptable margin for the shift of the interconnect features 114.

In contrast, if the vertical distance is zero (i.e., the top surfaces of the interconnect feature 104 and the dielectric material 102 are coplanar), there would be zero vertical distance between the interconnect feature 114a and the interconnect feature 104 in the example of FIG. 1C. Thus, a minimum lateral separation has to be maintained between the interconnect features 114a, 104, thereby reducing the acceptable margin of shift. However, in the IC 100, due to the vertical clearance distance H, there is always at least a vertical separation between the interconnect feature 114a and the interconnect feature 104, even if the interconnect feature 114a is at least partially above the interconnect feature 104, as illustrated in FIG. 1C.

FIG. 1C also illustrates the two lines L1 and L2. As discussed with respect to FIG. 1A, the vertical line L1 coincides with a left edge of the interconnect feature 104, whereas the vertical line L2 coincides with a right vertical edge of the layer 130. As seen in FIG. 1C, the margin of shift of the interconnect features 114 is such that it allows the interconnect feature 114 to be formed as far as the line L2. That is, for proper electrical isolation between the interconnect features 114a, 104, the right edge of the interconnect feature 14a has to be at or on left side of the line L2.

FIG. 1D illustrate a boundary of the recess 130 within the dielectric material 102 of the first interconnect layer 101, where the first interconnect feature 104 is within a bottom portion of the recess 130, in accordance with an embodiment of the present disclosure. For example, FIG. 1D illustrates a boundary of the recess 103 using thick dotted lines. As seen, the interconnect feature 104 occupies a bottom portion of the recess 103. A section of the layer 130, a section of the dielectric material 112, and a section of the interconnect feature 114b occupy a top portion of the recess 103. As illustrated, a top surface of the section of the dielectric material 112 within the recess 103 is at a lower level than the top surface of the dielectric material 102.

Figures 2A, 2B, 2C:
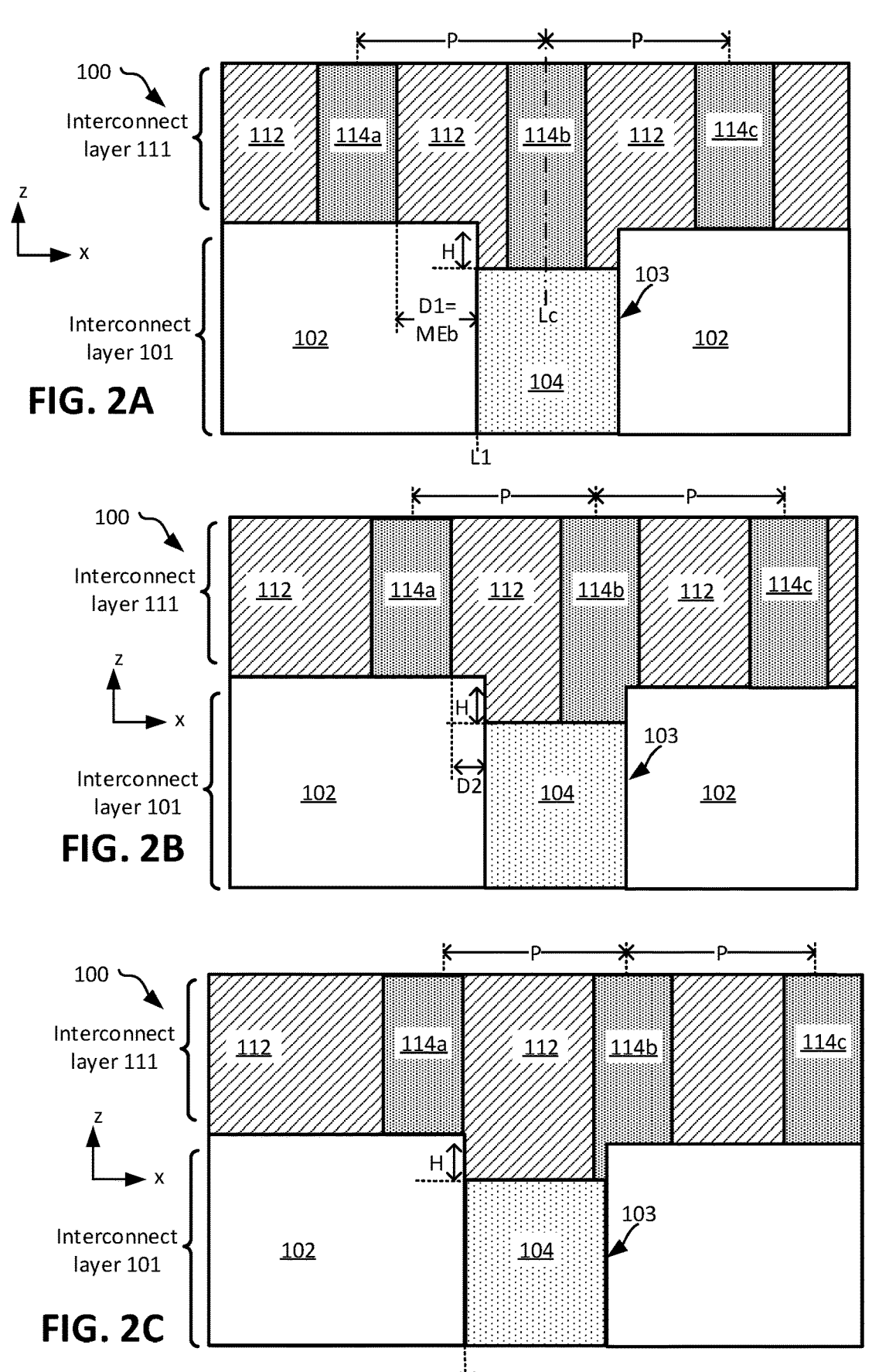
FIGS. 2A, 2B, and 2C illustrate cross-sectional views of a section of the IC of FIGS. 1A-1C, but without the conformal layer between the first and second interconnect layers, in accordance with an embodiment of the present disclosure.

FIGS. 2A, 2B, and 2C illustrate cross-sectional views of a section of the IC 100 of FIGS. 1A-1C, but without the conformal layer 130 between the first and second interconnect layers 101, 111, in accordance with an embodiment of the present disclosure. For example, similar to FIG. 1A, in FIG. 2A the interconnect feature 114b is fully landed with respect to the interconnect feature 104, and line Lc represents centers of the interconnect features 114b, 104. Similar to FIG. 1B, in FIG. 2B the interconnect feature 114b is partially landed with respect to the interconnect feature 104, e.g., with moderate amount of overlap between the bottom surface of the interconnect feature 114b and the top surface of the interconnect feature 104. Also, similar to FIG. 1C, in FIG. 2C the interconnect feature 114b is also partially landed with respect to the interconnect feature 104, but with even less overlap between the bottom surface of the interconnect feature 114b and the top surface of the interconnect feature 104.

In FIGS. 2A, 2B, and 2C, the vertical distance H provides a vertical gap between the interconnect feature 104 and the interconnect feature 114a, in addition to the lateral gap of D1 in FIG. 2A, the lateral gap of D2 in FIG. 2B, and the zero lateral gap in FIG. 2C.

FIGS. 2A and 2C also illustrate the vertical line L1 that coincides with a left edge of the interconnect feature 104. Comparing FIGS. 1C and 2C, in absence of the dielectric layer 130 in FIG. 2C, the interconnect feature 114a can move as far as line L1. That is, in FIGS. 2A-2C where the layer 130 is absent, for proper electrical isolation between the interconnect features 114a, 104, the right edge of the interconnect feature 14a has to be at or on left side of the line L1. Thus, as seen in FIG. 2C, the margin of shift of the interconnect features 114 without the layer 130 is such that it allows the interconnect feature 114 to be formed as far as the line L1. In contrast, with the layer 130, the margin of shift of the interconnect features 114 is such that it allows the interconnect feature 114 to be formed as far as the line L2 (see FIG. 1C). FIG. 2A (in which the interconnect feature 114b fully lands on the interconnect feature 104) illustrates the margin of shift MEb, which is the distance between the right edge of the interconnect feature 114a and the left edge of the interconnect feature 104.

Thus, comparing FIGS. 1C and 2C, the vertical height H (without the layer 130) provides a high margin of shift of the interconnect features 114, e.g., allows the interconnect feature 114 to be formed as far as the line L1, see FIG. 2C. The combination of the vertical height H and the layer 130 provides additional margin of shift of the interconnect features 114, e.g., allows the interconnect feature 114 to be formed as far as the line L2, see FIG. 1C.

FIG. 3 illustrates a flowchart depicting a method 300 of forming an IC (such as the IC 100 of FIGS. 1A-1C) comprising a first interconnect layer 101 and a second interconnect layer 111, wherein the first interconnect layer 101 includes (i) dielectric material 102, (ii) a recess 103 within the dielectric material 102, and (iii) a first interconnect feature 104 within the recess 103, wherein a top surface of the first interconnect feature 104 is at least 1 nm below a top surface of the dielectric material 102, and wherein the second interconnect layer 111 above the first interconnect layer 101 includes a second interconnect feature 114b that is conductively coupled to the first interconnect feature 104, wherein at least a part of a bottom section of the second interconnect feature 114b is within a top section of the recess 103, and wherein a conformal layer 130 is between the first and second interconnect layers, in accordance with an embodiment of the present disclosure. FIGS. 4A, 4A1, 4B, 4C, 4D, 4D1, 4D2, 4E, and 4F illustrate cross-sectional views of an IC (such as the IC 100 of FIGS. 1A, 1B, and 1C) in various stages of processing, in accordance with an embodiment of the present disclosure. FIGS. 3 and 4A-4F will be discussed in unison.

Figures 4A, 4A1, 4B, 4C:
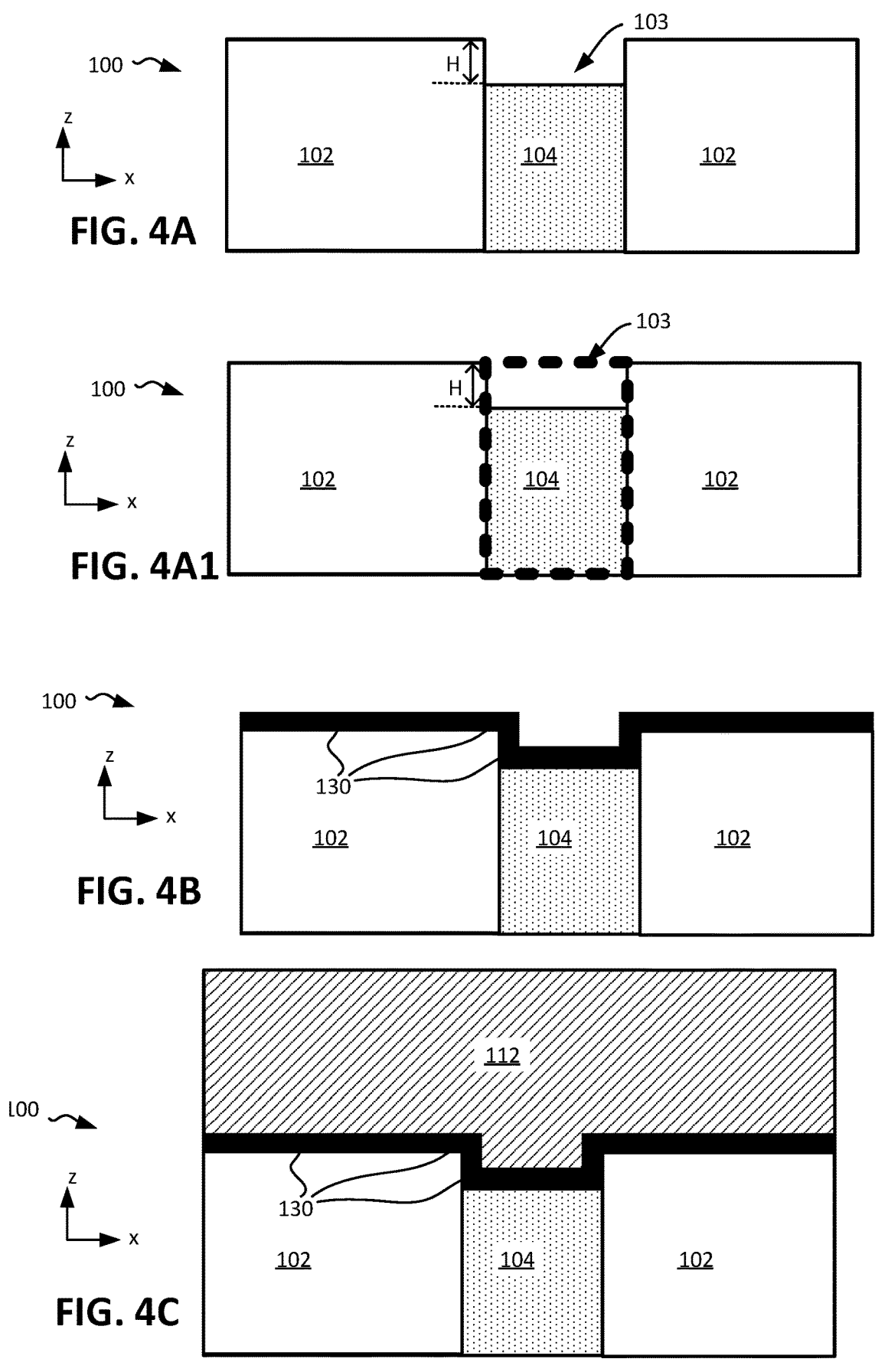

Referring to FIG. 3, the method 300 includes, at 304, forming a recess 103 within dielectric material 102, and forming the interconnect feature 104 within the recess 103. In an example, a top surface of the interconnect feature 104 is below a top surface of the dielectric material 102 by a vertical distance H. For example, FIG. 4A illustrates the dielectric material 102, with the recess 103 formed therewithin, and the interconnect feature 104 formed within the recess 103. In an example, the recess 130 may be formed within the dielectric material 102 using suitable masking, lithography, and etching technique, such as an anisotropic etch process. Subsequently, the recess 103 may be filed with conductive material of the interconnect feature 104 using an appropriate deposition technique, such as chemical vapor deposition (CVD), physical vapor deposition (PVD), atomic layer deposition (ALD), vapor-phase epitaxy (VPE), molecular beam epitaxy (MBE), liquid-phase epitaxy (LPE), or electroplating, for example.

In an example, the recess 103 is not fully filed with the conductive material, resulting in the vertical clearance H illustrated in FIG. 4A. For example, the recess 103 is initially fully filed with the conductive material of the interconnect feature 104, and subsequently the top portion of the conductive material is etched using a suitable etching technique, resulting in the vertical clearance H illustrated in FIG. 4A. This completes formation of the interconnect layer 101 comprising the dielectric material 102 and the interconnect feature 104.

FIG. 4A1 illustrates a boundary of the recess 103 using dotted lines. As seen, the interconnect feature 104 occupies a bottom portion of the recess 103. As will be discussed herein later (e.g., see FIG. 4F), a section of the layer 130, a section of the dielectric material 112, and a section of the interconnect feature 114b occupy a top portion of the recess 103.

Referring again to FIG. 3, the method 300 then proceeds from 304 to 308, where the layer 130 is deposited (e.g., conformally deposited) on the dielectric material 102 and the interconnect feature 104, as also illustrated in FIG. 4B. An appropriate deposition technique, such as CVD, PVD, ALD, VPE, MBE, or LPE, for example, may be used to deposit the conformal layer 130.

Referring again to FIG. 3, the method 300 then proceeds from 308 to 312, where dielectric material 112 is deposited above the layer 130, as illustrated in FIG. 4C. An appropriate deposition technique, such as CVD, PVD, ALD, VPE, MBE, or LPE, for example, may be used to deposit the dielectric material 112.

Referring again to FIG. 3, the method 300 then proceeds from 312 to 316, where a plurality of recesses 414a, 414b, 414c with a pitch P are formed within the dielectric material 112, where at least a section of the recess 414b is above and on the interconnect feature 104, and where the recess 414b may be fully landed or at least partially landed with respect to the interconnect feature 104. In an example, the recesses may be formed within the dielectric material 112 using suitable masking, lithography, and etching technique, such as an anisotropic etch process. Note that possible partially landing (e.g., instead of fully landing) of the recess 414b on the interconnect feature 104 may be due to unintended technical limitations in forming the recesses 414. The layer 130 acts as an etch stop layer, when forming the recesses 414.

Figure 4D:
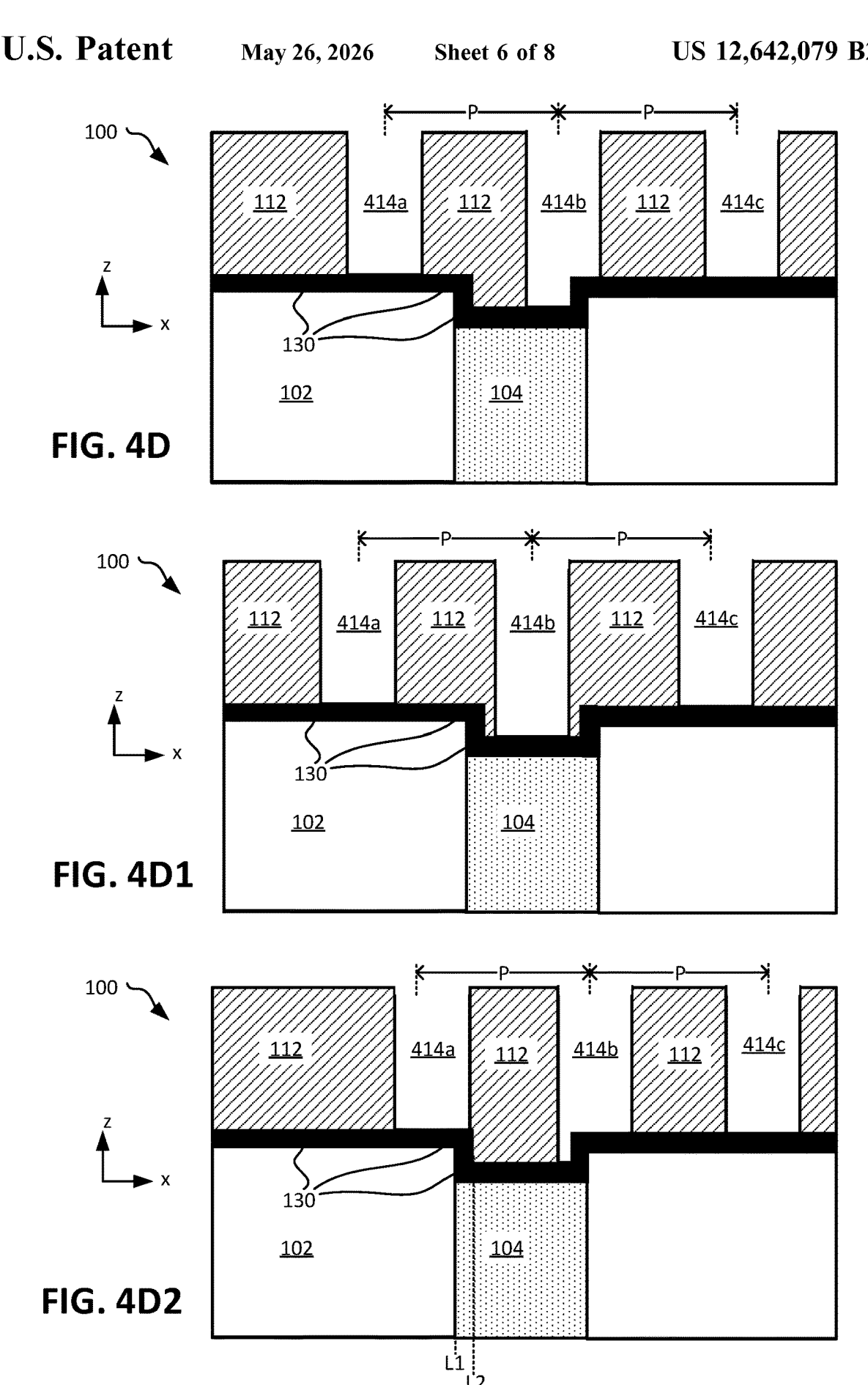

For example, FIG. 4D illustrates an example in which the recess 414b is somewhat off centered or partially landed with respect to the interconnect feature 104; FIG. 4D1 illustrates an example in which the recess 414b is substantially centered or fully landed with respect to the interconnect feature 104; and FIG. 4D2 illustrates an example in which the recess 414b is substantially off centered or partially landed with respect to the interconnect feature 104. Thus, for example, the overlap between the recess 414b and the interconnect feature 104 illustrated in FIG. 4D2 is less than that illustrated in FIG. 4D, whereas the recess 414b fully overlaps with the interconnect feature 104 (e.g., substantially centered) in FIG. 4D1. However, note that the pitch P (also discussed with respect to FIGS. 1A-1C) is the same in each of FIGS. 4D, 4D1, and 4D2. Thus, any shift in the interconnect features 114 occurs in unison.

In an example, whether the process 316 of FIG. 3 results in any of FIG. 4D, 4D1, or 4D2, if the right side of the recess 414a is on or on left side of the line L2 of FIG. 4D2, this will result in sufficient vertical distance between, and electrical isolation between, the eventual interconnect feature 114a and the interconnect feature 104. FIG. 4D2 illustrates the extreme case of shift, where the right side of the recess 414a is on the line L2; whereas FIG. 4D illustrates a substantially perfect and intended landing of the recess 414a on the interconnect feature 104.

As discussed, the recesses 414 may be formed within the dielectric material 112 using suitable masking, lithography, and etching technique, such as an anisotropic etch process. In the mask, the patterns have the pitch P, and hence, the recesses 414 also have the pitch P, as illustrated in FIGS. 4D, 4D1, and 4D2. However, the alignment of the mask may be slightly off from its intended position, e.g., due to unintended technical limitations in mask alignment, resulting in the shifts illustrated in FIGS. 4D and 4D2.

In an example, the locations of the recesses 414 of FIG. 4D result in corresponding locations of the interconnect features 114 of FIG. 1B; the locations of the recesses 414 of FIG. 4D1 result in corresponding locations of the interconnect features 114 of FIG. 1A; and the locations of the recesses 414 of FIG. 4D2 result in corresponding locations of the interconnect features 114 of FIG. 1C.

Figure 4E:
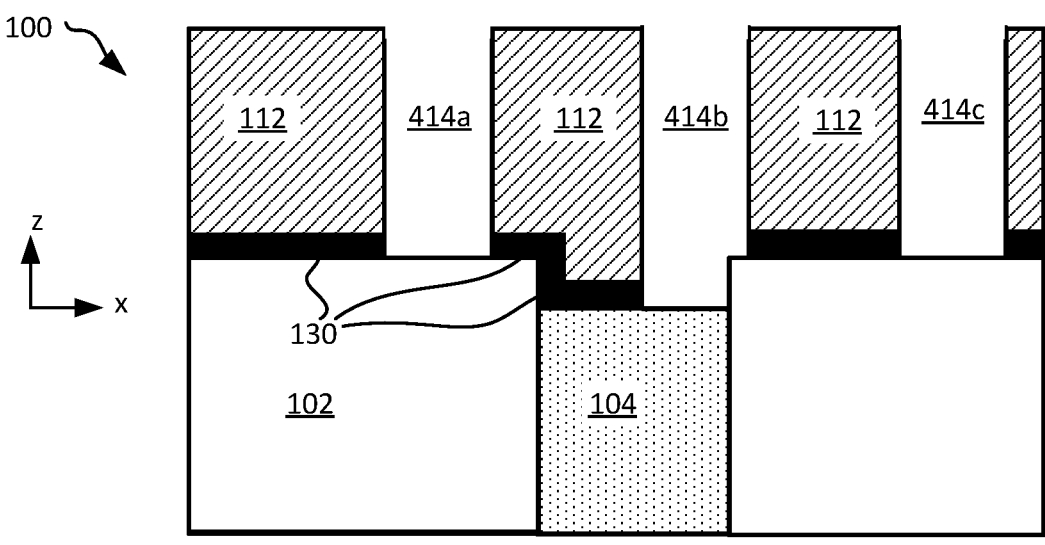
Figure 4F:
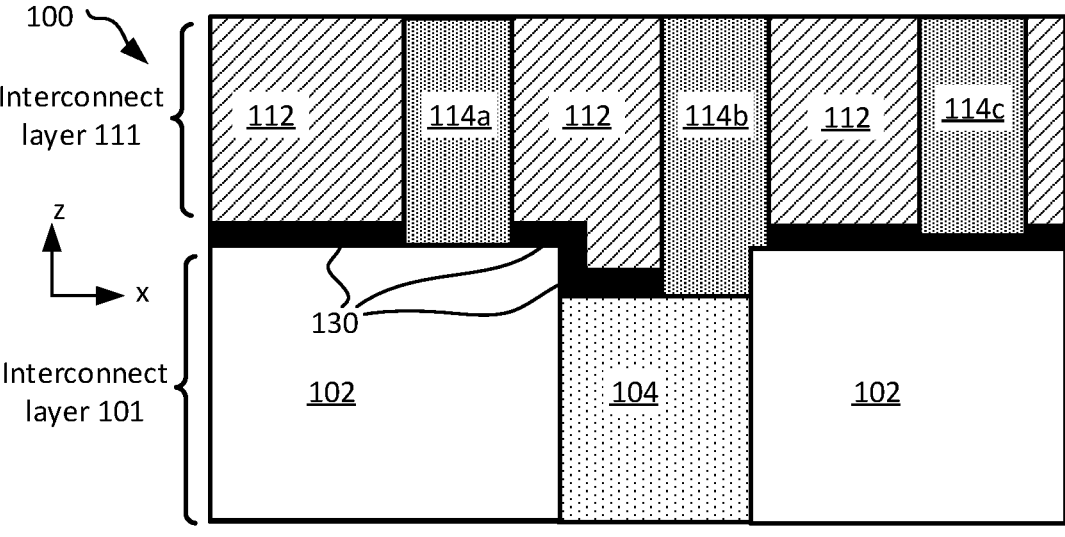

In subsequent FIGS. 4E and 4F, the locations of the recesses 414 of FIG. 4D are assumed, merely as an example. Put differently, the locations of the interconnect features 114 of FIG. 4F correspond to the locations of the recesses 414 of FIG. 4D.

Referring again to FIG. 3, the method 300 then proceeds from 316 to 320, where sections the layer 130 exposed through the recesses 414 are removed, as illustrated in FIG. 4E. For example, an isotropic etch process is employed to remove sections of the layer 130 that are below the recesses 414. The dielectric material 112 acts as a mask and prevents sections of the layer 130 below the dielectric material 112 from being etched, as illustrated in FIG. 4E. The dielectric material 102 acts as an eth stop layer during the removal of the layer 130.

Referring again to FIG. 3, the method 300 then proceeds from 320 to 324, where conductive material is deposited within the recesses 414a, 414b, 414c, to respectively form interconnect features 114a, 114b, 114c. After the conductive material is deposited within the recesses 414a, 414b, 414c, top surface of the conductive material of each recess is polished and planarized using an appropriate planarization technique, such as Chemical Mechanical Polishing (CMP), mechanical polishing, and/or another appropriate planarization technique. This completes formation of the interconnect layer 111 comprising the interconnect features 114, as illustrated in FIG. 4F. As discussed, locations of the interconnect features 114 in FIG. 4F are similar to those of FIG. 1B.

Note that the processes in method 400 are shown in a particular order for ease of description. However, one or more of the processes may be performed in a different order or may not be performed at all (and thus be optional), in accordance with some embodiments. Numerous variations on method 400 and the techniques described herein will be apparent in light of this disclosure.

Note that in the example of FIGS. 3 and 4A-4F, the conformal layer 130 is present between the two interconnect layers 101 and 111, as also illustrated in FIGS. 1A-1C. Here the layer 130 acts as an etch stop layer, e.g., when forming recesses 414 within the dielectric material 112. However, as also discussed with respect to FIGS. 2A-2C, in an example, the layer 130 may be absent from the IC 100. For example, if the layer 130 is to be absent from the IC 100, then the dielectric materials 102 and 112 may be etch selective with respect to each other, such that the dielectric material 102 (and not the layer 130) may act as the etch stop layer when forming the recesses 414. Accordingly, formation of the IC 100 without the layer 130 (e.g., as discussed with respect to FIGS. 2A-2C) will be apparent from the discussion with respect to FIGS. 3 and 4A-4F.

Example System

Figure 5:
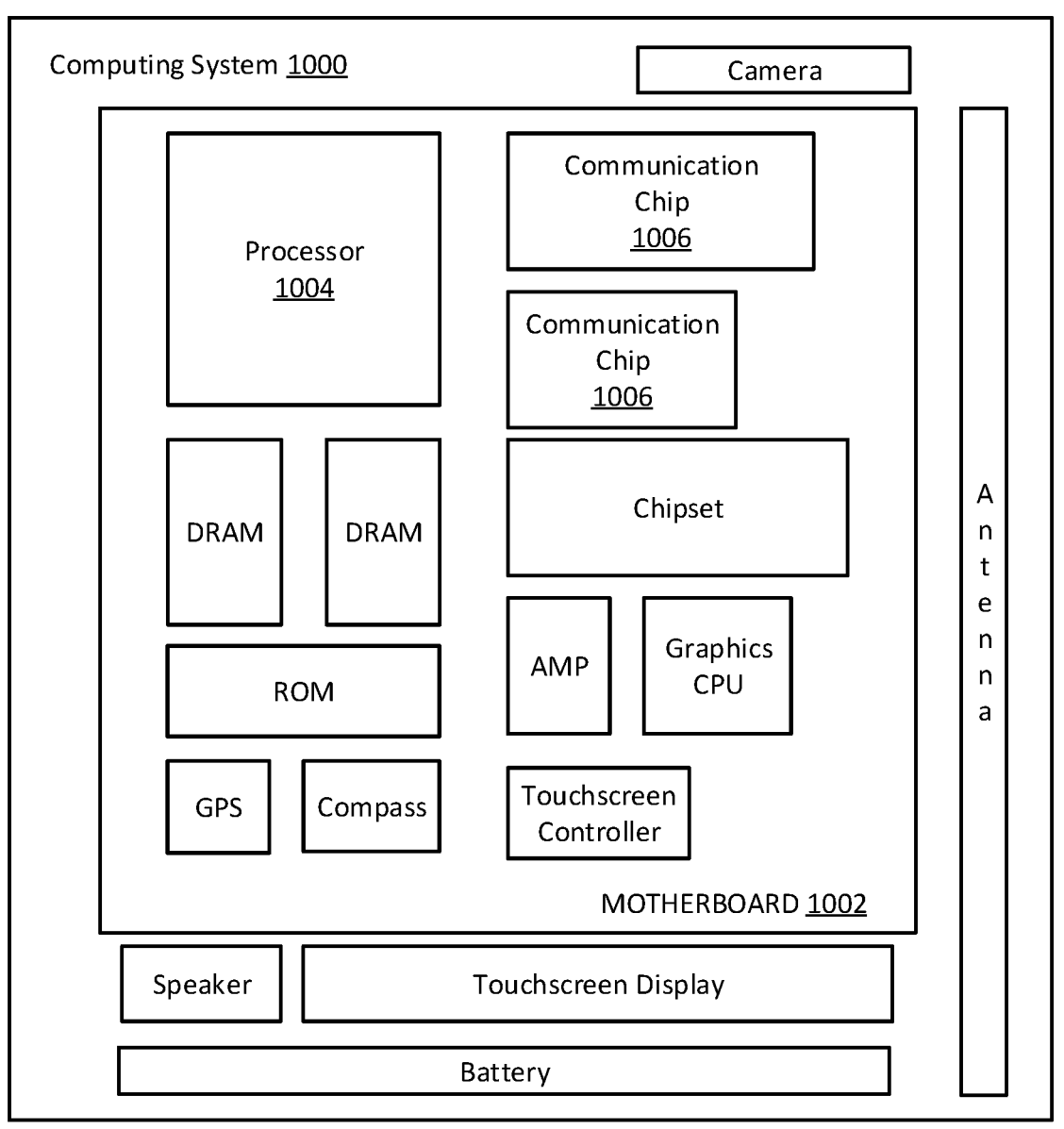
FIG. 5 illustrates a computing system implemented with integrated circuit structures having one or more interconnect features formed using the techniques disclosed herein, in accordance with some embodiments of the present disclosure.

FIG. 5 illustrates a computing system 1000 implemented with integrated circuit structures and/or the interconnect features formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1. An integrated circuit device comprising: a first interconnect layer comprising (i) a first dielectric material, (ii) a recess within the first dielectric material, and (iii) a first interconnect feature within the recess, wherein a top surface of the first interconnect feature is at least 1 nanometer (nm) below a top surface of the first dielectric material; and a second interconnect layer above the first interconnect layer, the second interconnect layer comprising (i) a second dielectric material, and (ii) a second interconnect feature within the second dielectric material, wherein the second interconnect feature is at least in part above, and conductively coupled to, the first interconnect feature, and wherein a bottom section of the second interconnect feature is within a top section of the recess.

Example 2. The integrated circuit device of example 1, wherein: a first section of a bottom surface of the second interconnect feature is above and on the first interconnect feature; and a second section of the bottom surface of the second interconnect feature is above and on the first dielectric material.

Example 3. The integrated circuit device of any one of examples 1-2, further comprising: a conformal layer separating at least a section of the first dielectric material from a corresponding section of the second dielectric material, wherein the conformal layer is absent between a junction of the first interconnect feature and the second interconnect feature.

Example 4. The integrated circuit device of example 3, wherein: a section of the second interconnect feature is above a first section of a top surface of the first interconnect feature, and not above a second section of the top surface of the first interconnect feature; and the conformal layer is above and on the second section of the top surface of the first interconnect feature.

Example 5. The integrated circuit device of example 4, wherein the conformal layer is absent above the first section of the top surface of the first interconnect feature.

Example 6. The integrated circuit device of any one of examples 4-5, wherein: the second dielectric material extends at least in part within the recess, above the second section of the top surface of the first interconnect feature; and the conformal layer separates the second section of the top surface of the first interconnect feature from the second dielectric material extending at least in part within the recess.

Example 7. The integrated circuit device of any one of examples 3-6, wherein: the second interconnect layer comprises a third interconnect feature within the second dielectric material; and a section of the third interconnect feature is above the first interconnect feature, the section of the third interconnect feature separated from the first interconnect feature by the conformal layer.

Example 8. The integrated circuit device of any one of examples 3-7, wherein the conformal layer comprises at least one of oxygen or nitrogen.

Example 9. The integrated circuit device of any one of examples 3-7, wherein the conformal layer comprises one or more of aluminum, silicon, oxygen, carbon, or nitrogen.

Example 10. The integrated circuit device of any one of examples 1-9, wherein: a section of the second dielectric material extends within the recess, such that a bottom surface of the section of the second dielectric material extending within the recess is at a lower level than the top surface of the first dielectric material.

Example 11. The integrated circuit device of example 10, wherein: the section of the second dielectric material extending within the recess is a first section of the second dielectric material; and a second section of the second dielectric material outside the recess has another bottom surface that is at a higher level than the top surface of the first dielectric material.

Example 12. The integrated circuit device of any one of examples 1-11, wherein the first interconnect feature comprises a first conductive material, and the second interconnect feature comprises a second conductive material, with a seam or an interface at a junction of the first and second conductive materials.

Example 13. The integrated circuit device of example 12, wherein the first and second conductive materials have a same element.

Example 14. The integrated circuit device of any one of examples 12-13, wherein the first and second conductive materials are compositionally different.

Example 15. The integrated circuit device of any one of examples 1-14, wherein the top surface of the first interconnect feature is at least 2 nm below the top surface of the first dielectric material.

Example 16. The integrated circuit device of any one of examples 1-15, wherein the top surface of the first interconnect feature is at least 3.5 nm below the top surface of the first dielectric material.

Example 17. The integrated circuit device of any one of examples 1-16, wherein the first and second dielectric materials have a same element.

Example 18. The integrated circuit device of any one of examples 1-17, wherein the first and second dielectric materials are compositionally different.

Example 19. The integrated circuit device of any one of examples 1-18, wherein the first interconnect feature is a conductive via, and the second interconnect feature is a conductive line.

Example 20. An integrated circuit device comprising: a first dielectric material, and a recess within the first dielectric material; a first interconnect feature within a bottom portion of the recess, the first interconnect feature not within a top portion of the recess; a second dielectric material above the first dielectric material; and a second interconnect feature within the second dielectric material, wherein (i) at least a section of the second dielectric material is within a first section of the top portion of the recess, and (ii) at least a section of second interconnect feature is within a second section of the top portion of the recess.

Example 21. The integrated circuit device of example 20, wherein the bottom portion of the recess, which includes the first interconnect feature, is at most 90% of the recess.

Example 22. The integrated circuit device of any one of examples 20-21, wherein a top surface of the first interconnect feature is at least 1 nanometer (nm) below a top surface of the first dielectric material.

Example 23. The integrated circuit device of any one of examples 20-22, wherein a top surface of the first interconnect feature is at least 3.5 nanometers (nm) below a top surface of the first dielectric material.

Example 24. The integrated circuit device of any one of examples 20-23, wherein: at least the section of the second dielectric material within the first section of the top portion of the recess is a first section of the second dielectric material; a second section of the second dielectric material is outside the recess; a first bottom surface of the first section of the second dielectric material is at a lower level than a top surface of the first dielectric material; and a second bottom surface of the second section of the second dielectric material is at a upper level than the top surface of the first dielectric material.

Example 25. The integrated circuit device of any one of examples 20-24, wherein the first interconnect feature comprises a first conductive material, and the second interconnect feature comprises a second conductive material, with a seam or an interface at a junction of the first and second conductive materials.

Example 26. The integrated circuit device of example 25, wherein the junction of the first and second interconnect features is at least 1 nanometer (nm) below a top surface of the first dielectric material.

Example 28. A method of forming an integrated circuit, comprising: forming a recess within a first dielectric material; forming a first interconnect feature within a bottom portion of the recess; depositing a second dielectric material above the first dielectric material; forming a second interconnect feature within the second dielectric material, wherein at least a section of the second dielectric material occupies a first section of a top portion of the recess, and wherein at least a section of the second interconnect feature occupies a second section of the top portion of the recess.

Example 29. The method of example 28, wherein forming the first interconnect feature comprises: forming the first interconnect feature within the recess; and removing a top portion of the first interconnect feature, such that the first interconnect feature remains within the bottom portion of the recess, and not within the top portion of the recess.

Example 30. The method of any one of examples 28-29, further comprising: prior to depositing the second dielectric material, depositing a conformal layer on the first dielectric material and on a top surface of the first interconnect feature.

Example 31. The method of example 30, wherein the recess is a first recess, and wherein forming the second interconnect feature within the second dielectric material comprises: forming a second recess within the second dielectric material, the second recess exposing a section of the conformal layer; removing the section of the conformal layer through the second recess; and forming the second interconnect feature within the second recess.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously

What is claimed is:

1. An integrated circuit device comprising:
a first interconnect layer comprising (i) a first dielectric material, (ii) a recess within the first dielectric material, and (iii) a first interconnect feature within the recess, wherein a top surface of the first interconnect feature is at least 1 nanometer (nm) below a top surface of the first dielectric material;
a second interconnect layer above the first interconnect layer, the second interconnect layer comprising (i) a second dielectric material, and (ii) a second interconnect feature within the second dielectric material, wherein the second interconnect feature is at least in part above, and conductively coupled to, the first interconnect feature, and wherein a bottom section of the second interconnect feature is within a top section of the recess; and
a conformal layer separating at least a section of the first dielectric material from a corresponding section of the second dielectric material;
wherein the second interconnect layer further comprises a third interconnect feature within the second dielectric material, wherein a portion of a bottommost surface of the third interconnect feature is directly on a portion of the conformal layer and is directly above a portion of the first interconnect feature, such that the conformal layer is between the portion of the bottommost surface of the third interconnect feature and the portion of the first interconnect feature.

2. The integrated circuit device of claim 1, wherein:
a first section of a bottom surface of the second interconnect feature is above and on the first interconnect feature; and
a second section of the bottom surface of the second interconnect feature is above and on the first dielectric material.

3. The integrated circuit device of claim 1, wherein the conformal layer is absent between a junction of the first interconnect feature and the second interconnect feature.

4. The integrated circuit device of claim 3, wherein:
a section of the second interconnect feature is above a first section of a top surface of the first interconnect feature, and not above a second section of the top surface of the first interconnect feature; and
the conformal layer is above and on the second section of the top surface of the first interconnect feature.

5. The integrated circuit device of claim 4, wherein:
the second dielectric material extends at least in part within the recess, above the second section of the top surface of the first interconnect feature; and
the conformal layer separates the second section of the top surface of the first interconnect feature from the second dielectric material extending at least in part within the recess.

6. The integrated circuit device of claim 3, wherein:
the second interconnect layer comprises a third interconnect feature within the second dielectric material; and
a section of the third interconnect feature is above the first interconnect feature, the section of the third interconnect feature separated from the first interconnect feature by the conformal layer.

7. The integrated circuit device of claim 3, wherein the conformal layer comprises at least one of oxygen or nitrogen.

8. The integrated circuit device of claim 1, wherein:
a section of the second dielectric material extends within the recess, such that a bottom surface of the section of the second dielectric material extending within the recess is at a lower level than the top surface of the first dielectric material.

9. The integrated circuit device of claim 8, wherein:
the section of the second dielectric material extending within the recess is a first section of the second dielectric material; and
a second section of the second dielectric material outside the recess has another bottom surface that is at a higher level than the top surface of the first dielectric material.

10. The integrated circuit device of claim 1, wherein the first interconnect feature comprises a first conductive material, and the second interconnect feature comprises a second conductive material, with a seam or an interface at a junction of the first and second conductive materials.

11. The integrated circuit device of claim 1, wherein the top surface of the first interconnect feature is at least 3.5 nm below the top surface of the first dielectric material.

12. The integrated circuit device of claim 1, wherein the first interconnect feature is a conductive via, and the second interconnect feature is a conductive line.

13. An integrated circuit device comprising:
a first dielectric material, and a recess within the first dielectric material;
a first interconnect feature within a bottom portion of the recess, the first interconnect feature not within a top portion of the recess;
a second dielectric material above the first dielectric material;
a second interconnect feature within the second dielectric material; and
a conformal layer separating at least a section of the first dielectric material from a corresponding section of the second dielectric material,
wherein a portion of a bottommost surface of the second interconnect feature is directly on a portion of the conformal layer and is directly above a portion of the first interconnect feature, such that the conformal layer is between the portion of the bottommost surface of the second interconnect feature and the portion of the first interconnect feature.

14. The integrated circuit device of claim 13, wherein the bottom portion of the recess, which includes the first interconnect feature, is at most 90% of the recess.

15. The integrated circuit device of claim 13, wherein:
a first section of the second dielectric material is within the top portion of the recess;
a second section of the second dielectric material is outside the recess;
a first bottom surface of the first section of the second dielectric material is at a lower level than a top surface of the first dielectric material; and
a second bottom surface of the second section of the second dielectric material is at a higher level than the top surface of the first dielectric material.

16. The integrated circuit device of claim 13, wherein the first interconnect feature comprises a first conductive material, and the second interconnect feature comprises a second conductive material, with a seam or an interface at a junction of the first and second conductive materials.

17. The integrated circuit device of claim 16, wherein the junction of the first and second interconnect features is at least 1 nanometer (nm) below a top surface of the first dielectric material.

18. An integrated circuit comprising:
   a first interconnect layer comprising a first dielectric layer and a first conductive interconnect feature within the first dielectric layer, wherein a top surface of the first conductive interconnect feature is at least 1 nanometer (nm) below a top surface of the first dielectric layer;
   a second interconnect layer above the first interconnect layer, the second interconnect layer comprising a second dielectric layer and a second conductive interconnect feature within the second dielectric layer; and
   a conformal layer separating at least a section of the first dielectric layer from a corresponding section of the second dielectric layer, wherein a portion of a bottommost surface of the second conductive interconnect feature is directly on a portion of the conformal layer and is directly above a portion of the first conductive interconnect feature, such that the conformal layer is between the portion of the bottommost surface of the second conductive interconnect feature and the portion of the first conductive interconnect feature.

19. The integrated circuit of claim 18, wherein:
   a portion of the bottommost surface of the second interconnect feature is directly on the top surface of the first dielectric layer.

20. The integrated circuit of claim 18, further comprising a third conductive interconnect feature within the second dielectric layer, wherein at least part of the third conductive interconnect feature is directly on the first conductive interconnect feature, such that the third conductive interconnect feature contacts the first conductive interconnect feature below the top surface of the first dielectric layer.

* * * * *